United States Patent
Kobayashi et al.

(10) Patent No.: US 6,940,552 B1
(45) Date of Patent: Sep. 6, 2005

(54) PHOTOELECTRIC CONVERSION DEVICE

(75) Inventors: Isao Kobayashi, Atsugi (JP); Noriyuki Kaifu, Hachioji (JP); Toshikazu Tamura, Utsunomiya (JP); Tomoyuki Yagi, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 941 days.

(21) Appl. No.: 09/651,000

(22) Filed: Aug. 31, 2000

(30) Foreign Application Priority Data

Sep. 2, 1999 (JP) ............................................ 11-248822

(51) Int. Cl.⁷ .......................... H04N 5/335; H04N 3/14; H01L 31/00

(52) U.S. Cl. ...................... 348/307; 348/304; 348/308; 257/448

(58) Field of Search ................................. 348/301, 304, 348/307, 308, 241; 257/448, 208.1; 250/208.1

(56) References Cited

U.S. PATENT DOCUMENTS

| | | | |
|---|---|---|---|
| 4,584,607 A | * 4/1986 | Miyazawa | 358/482 |
| 4,745,488 A | 5/1988 | Kaifu et al. | |
| 4,926,058 A | 5/1990 | Iwamoto et al. | |
| 5,060,040 A | 10/1991 | Saika et al. | |
| 5,233,442 A | 8/1993 | Kawai et al. | |
| 5,272,548 A | 12/1993 | Kawai et al. | |
| 5,317,406 A | 5/1994 | Kobayashi et al. | |
| 5,335,094 A | * 8/1994 | Kaifu et al. | 358/494 |
| 5,812,109 A | 9/1998 | Kaifu et al. | |
| 5,812,284 A | 9/1998 | Mizutani et al. | |
| 5,841,180 A | * 11/1998 | Kobayashi et al. | 257/448 |
| 5,914,485 A | 6/1999 | Kobayashi et al. | |
| 6,034,406 A | 3/2000 | Kobayashi et al. | |
| 6,084,939 A | 7/2000 | Tamura | |
| 6,127,684 A | 10/2000 | Kaifu | |
| 6,133,897 A | * 10/2000 | Kouchi | 345/100 |
| 6,191,411 B1 | 2/2001 | Kaifu | |
| 6,245,601 B1 | 6/2001 | Kobayashi et al. | |
| 6,448,561 B1 | * 9/2002 | Kaifu | 250/370.09 |
| 2001/0010551 A1 | * 8/2001 | Dierickx | 348/241 |

* cited by examiner

*Primary Examiner*—Thai Tran
*Assistant Examiner*—Lin Ye
(74) *Attorney, Agent, or Firm*—Fitzpatrick, Cella, Harper & Scinto

(57) ABSTRACT

To read stable image information by making small in a short time the amount of change in potential at the time the potential of signal wires or sensor bias wires drops a moment, the device is, in the refresh mode of photoelectric conversion pixels, so driven that the timing at which two drive wires are driven overlaps which are sequentially and at least consecutively driven by the control means among drive wires while keeping the signal wires at a reset potential.

9 Claims, 6 Drawing Sheets

PHOTOELECTRIC CONVERSION DEVICE

BACKGROUND OF THE INVENTION

1. Field of the Invention

This invention relates to a method of driving an image pickup device, and more particularly to a method of driving an image pickup device preferably used in photoelectric transducers (photoelectric conversion devices) formed by a large-area process, as exemplified by two-dimensional photoelectric transducers which perform equal-size reading, such as facsimile machines, digital copying machines and X-ray imaging devices.

2. Related Background Art

Reading systems employing reduction optical systems and CCD type sensors have been used as reading systems such as facsimile machines, digital copying machines and X-ray imaging devices. In recent years, however, development of photoelectric conversion semiconductor materials as typified by hydrogenated amorphous silicon (hereinafter "a-Si") has brought about remarkable development on what is called contact type sensors, in which photoelectric conversion elements and signal-processing components are formed on a large-area substrate and information is read with an optical system which is equal-size to the information source. In particular, the a-Si has an advantage that it can be used not only as a photoelectric conversion material but also as a semiconductor material for thin-film field-effect transistors (hereinafter "TFT") and hence a photoelectric conversion semiconductor layer and a TFT semiconductor layer can simultaneously be formed.

However, performance specifications required for large-area photoelectric transducers become severer year by year. Especially in the two-dimensional photoelectric transducers which perform equal-size reading, such as X-ray imaging devices inclusive of those for internal examination or non-destructive examination, it is required to reduce as far as possible the doses of X-rays, which affect human bodies, and to obtain more highly precise data uniformly and in a short time in the two-dimensional area. Under such requirements, it is required to make as small as possible any uneven signal outputs from photoelectric conversion elements and to drive the devices in a short time.

SUMMARY OF THE INVENTION

The present invention was made taking account of the above problems. Accordingly, an object of the present invention is to provide an image pickup device driving method by which uneven signal outputs from photoelectric conversion elements can be made smaller.

Another object of the present invention is to provide an image pickup device driving method by which uneven signal outputs can be made smaller and also the operation relating to reading can be shortened to enable high-speed driving.

Still another object of the present invention is to provide an image pickup device driving method by which X-ray doses can be reduced and also more highly precise data can be provided.

The present invention provides a method of driving an image pickup device having a photoelectric conversion matrix in which a plurality of photoelectric conversion pixels to which photoelectric conversion elements and switching elements are connected are arranged in an array, and having;

a plurality of drive wires connected individually to the switching elements arranged in a row or column of the photoelectric conversion matrix;

a plurality of signal wires connected individually to the output side of the switching elements arranged in a row or column of the photoelectric conversion matrix; and a control means by which the drive wires are driven and the switching elements connected to the respective drive wires are turned on to connect the signal wires to the photoelectric conversion elements;

the photoelectric conversion pixels being driven in a photoelectric conversion mode, a signal electric-charge transfer mode and a refresh mode;

wherein the refresh mode is so driven that the timing at which two drive wires are driven overlaps which are sequentially and at least consecutively driven for each of the row or column by the control means among the drive wires while keeping the signal wires at a reset potential.

The present invention also provides a method of driving an image pickup device in which a plurality of photoelectric conversion pixels to which photoelectric conversion elements and switching elements are connected are two-dimensionally arranged; the switching elements are connected to drive wires for each line, the drive wires are sequentially driven in one direction and signal electric charges are transferred to signal wires provided in the direction different from the one direction, to read signals sequentially; and the photoelectric conversion elements are driven in a photoelectric conversion mode, a signal electric-charge transfer mode and a refresh mode;

wherein, in the refresh mode, the timing at which two drive wires are driven overlaps which are sequentially driven in the one direction and driven at least consecutively among the drive wires while keeping the signal wires at a reset potential.

The above problems can be solved by driving the image pickup device in this way, i.e., by overlapping the timing at which two drive wires provided at least consecutively are turned on. Namely, any uneven signal outputs in the two-dimensional area can be made minimum, and the refresh processing can be made in a short time.

BRIEF DESCRIPTION OF THE DRAWINGS

FIG. 1A is a schematic plan view, and FIG. 1B a schematic cross-sectional view.

DETAILED DESCRIPTION OF THE PREFERRED EMBODIMENTS

The present invention will be described below in detail with reference to the accompanying drawings.

Figure 1A:
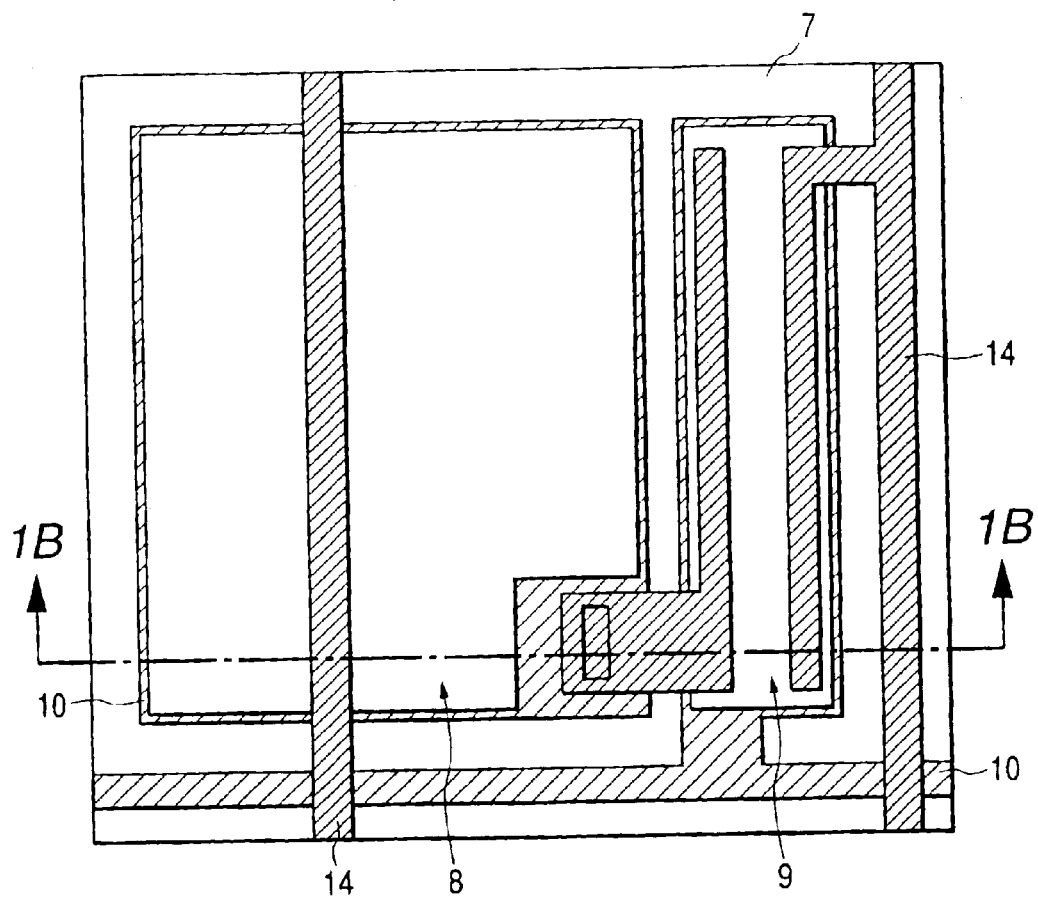
FIGS. 1A and 1B illustrate an example of a photoelectric conversion pixel.
Figure 1B:
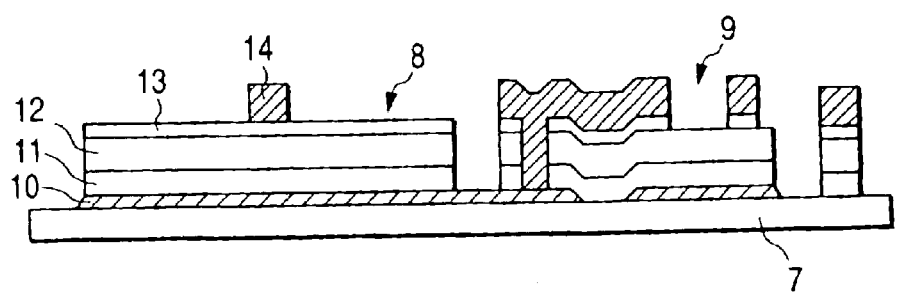

FIGS. 1A and 1B are schematic views with reference to which a preferred example of the constitution of a photoelectric conversion pixel according to the present invention is described. FIG. 1A is a schematic plan view, and FIG. 1B is a schematic cross-sectional view along the line 1B—1B in FIG. 1A. As shown in FIGS. 1A and 1B, the photoelectric conversion pixel has a substrate 7 having insulating properties at least at its surface as exemplified by a glass substrate, and provided thereon a sensor 8 (which is a photoelectric conversion area or element) and a TFT (thin-film transistor) 9. In the pixel shown in FIGS. 1A and 1B, both the sensor 8 and the TFT 9 have amorphous silicon layers as semiconductor layers, and these semiconductor layers are simultaneously formed by an amorphous silicon thin-film process. The sensor 8 shown in the drawings is an MIS type (metal-insulator-silicon type) sensor. The sensor 8 and TFT 9 are formed by forming on the glass substrate 7 a lower metal layer 10, an insulating layer 11, a semiconductor layer 12, an n+-type layer 13, an upper metal layer 14 and a protective layer (not shown; an amorphous silicon nitride film or a polyimide film) in this order, and patterning the layers in the desired shapes.

Figure 2:
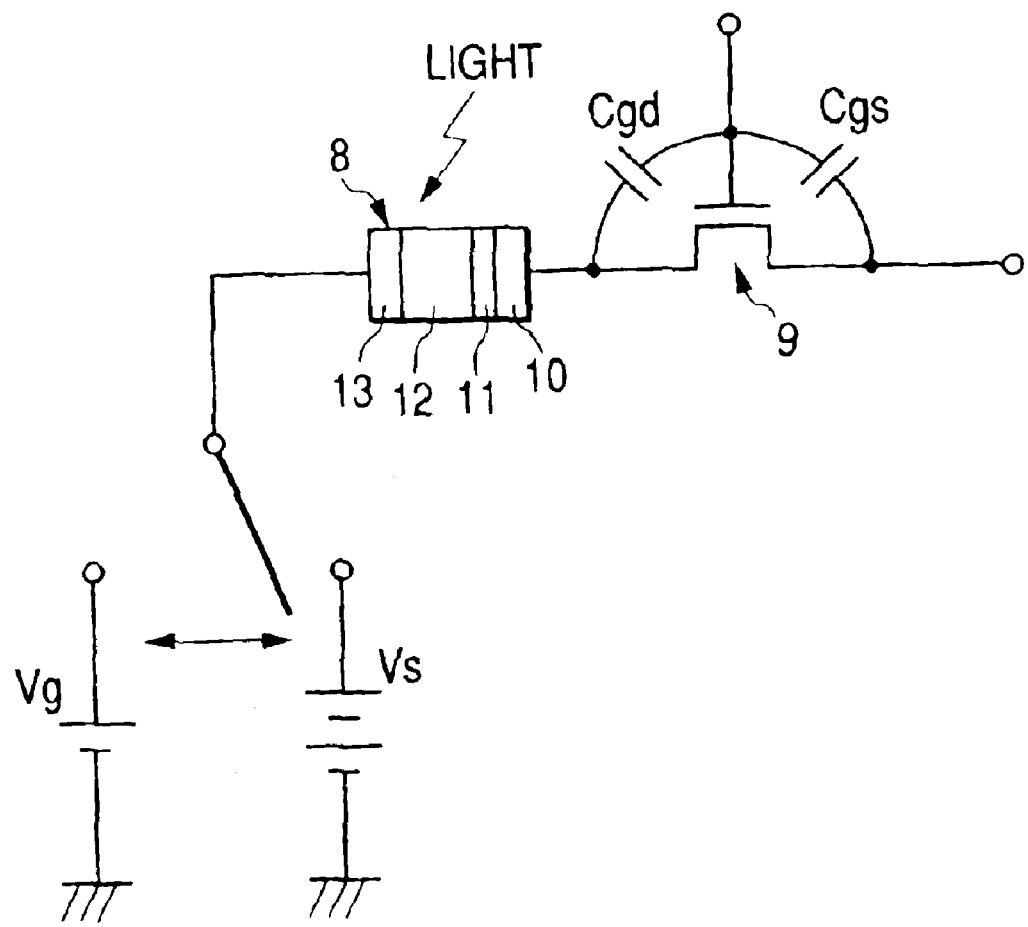
FIG. 2 is a schematic equivalent circuit diagram of a photoelectric conversion pixel.

FIG. 2 is a schematic equivalent circuit diagram showing connection relationship of each element of the photoelectric conversion pixel shown in FIGS. 1A and 1B. Electric charges are generated in accordance with the amount of the light made incident on the sensor 8, and the electric charges thus generated are transferred to a reading device (not shown) through the TFT 9 to operate the reading.

Figure 3:
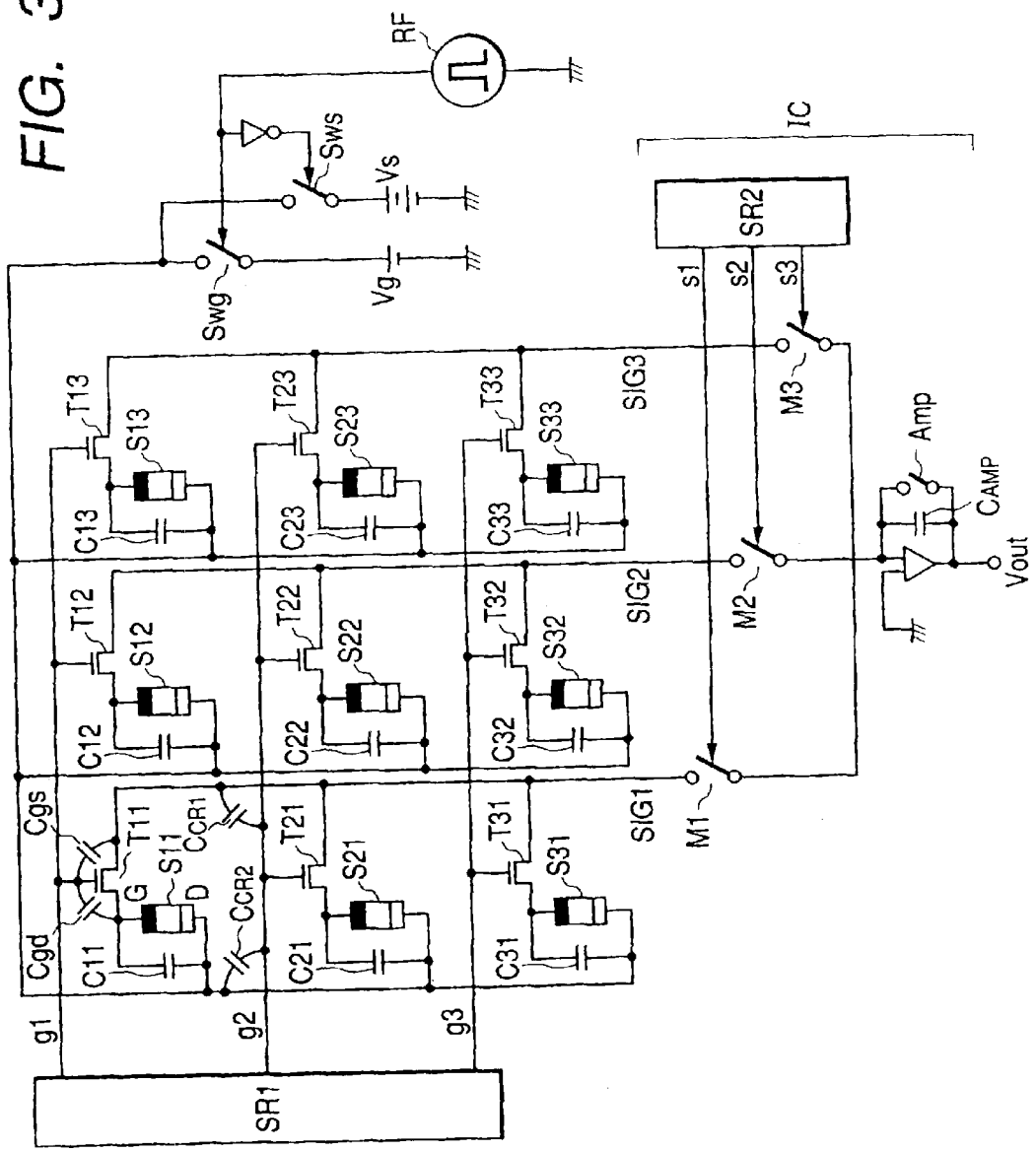
FIG. 3 is a schematic equivalent circuit diagram of a photoelectric transducer.

A whole circuit diagram of a photoelectric transducer where 3×3 (three times three) pixels constituted of the photoelectric conversion pixel shown in FIG. 2 are arranged is shown in FIG. 3.

In FIG. 3, S11 to S33 denote photoelectric conversion elements, the lower-electrode side of which is shown by a letter symbol G, and the upper-electrode side by D. C11 to C33 denote capacitors for storage, and are shown in this way on the equivalent circuit because the photoelectric conversion elements S11 to S33 act also as capacitors. T11 to T33 denote TFTs for transfer. Vs denotes a power source for reading, and Vg a power source for refreshing, which are connected to the D-side electrodes of all the photoelectric conversion elements S11 to S33 via switches SWs and SW g, respectively. The switch SWs is connected to a refresh control circuit RF via an inverter, and the switch SWg is directly connected thereto, which are so controlled that the switch SWg is turned on in the refresh period.

In the above photoelectric transducer, the nine pixels in total are divided into three blocks, and outputs of three pixels for each block are simultaneously transferred. Through this signal wiring, SIG1 to SIG3, they are sequentially converted to outputs by a detecting integrated circuit IC and then outputted ($V_{out}$). Also, the three pixels in one block are laterally arranged and the three blocks are perpendicularly arranged in-order so that all the pixels are two-dimensionally arranged.

A phosphor such as cesium iodide (CsI) may also be formed on the upper part of each pixel. Where X-rays enter from the upper part, they are brought to wavelength conversion by the phosphor, a wavelength converter, and are converted to light having a wavelength to which photoelectric conversion elements are sensible. This light is made incident on the photoelectric conversion elements.

The above photoelectric transducer is operated as described below. Operation of a photoelectric transducer which constitutes the prior art of the present invention is described first in greater detail with reference to the above FIG. 3 and a timing chart shown in FIG. 4.

In the first place, high(Hi)-level pulses are applied to control wirings g1 to g3 and s1 to s3 by shift resistors SR1 and SR2. Thereupon the transferring TFTs T11 to T33 and switches M1 to M3 are turned on to conduct, and the G-side electrodes of all the photoelectric conversion elements S11 to S33 come to have GND potential (since the input terminal of an integrated detector Amp has been designed to have GND potential). Simultaneously the refresh control circuit RF outputs high-level pulses and the switch SWg is turned on, so that the D-side electrodes of all the photoelectric conversion elements S11 to S33 come to have positive potential by means of the refreshing power source Vg. Thereupon all the photoelectric conversion elements S11 to S33 are brought into a refresh mode to become refreshed. Next, the refresh control circuit RF outputs low(Lo)-level pulses and the switch SWs is turned on, so that the D-side electrodes of all the photoelectric conversion elements S11 to S33 come to have a higher positive potential by means of the reading power source Vs. Thereupon all the photoelectric conversion elements S11 to S33 are brought into a photoelectric conversion mode and simultaneously the capacitors C11 to C33 are initialized. In this state, low-level pulses are applied to the control wirings g1 to g3 and s1 to s3 by the shift resistors SR1 and SR2. Thereupon the switches M1 to M3 of the transferring TFTs T11 to T33 are turned off, so that the G-side electrodes of all the photoelectric conversion elements S11 to S33 become open as viewed from DC but the potential is retained by the capacitors C11 to C33. At this point of time, however, the X-rays are still not made incident, and hence the light does not enter any of the photoelectric conversion elements S11 to S33 and any photoelectric current does not flow. In this state, the X-rays are pulsewise emitted and are passed through a subject such as a human body to enter the phosphor, the wavelength converter, whereupon the X-rays are converted to light to which photoelectric conversion elements are sensible. This light involves the information of internal structure of the subject such as a human body. The photoelectric current made by this light to flow is accumulated in the individual capacitors C11 to C33, and is retained also after the X-rays are stopped entering.

Next, a high-level control pulse is applied to the control wiring g1 by the shift resistor SR1, and a control pulse is applied to the control wirings s1 to s3 by the shift resistor SR2, whereby light signals v1 to v3 are sequentially outputted through the switches M1 to M3 of the transferring TFTs T11 to T33. Similarly, other light signals are also sequentially outputted by the controlling of the shift resistors SR1 and SR2. Thus, the two-dimensional information of internal structure of the subject such as a human body is obtained as v1 to v9. Operation is completed here when a still image is to be obtained, but the operation up to this is repeated when an animated image is to be obtained.

In the above photoelectric transducer, the D-side electrodes of the photoelectric conversion elements are connected in common, and their common wirings are controlled to the potential of the refreshing power source Vg and reading power source Vs via the switch SWg and switch SWs. Hence, all the photoelectric conversion elements S11 to S33 can simultaneously be switched to the refresh mode and the photoelectric conversion mode. Thus, light outputs can be obtained through one TFT for each pixel.

Figure 4:
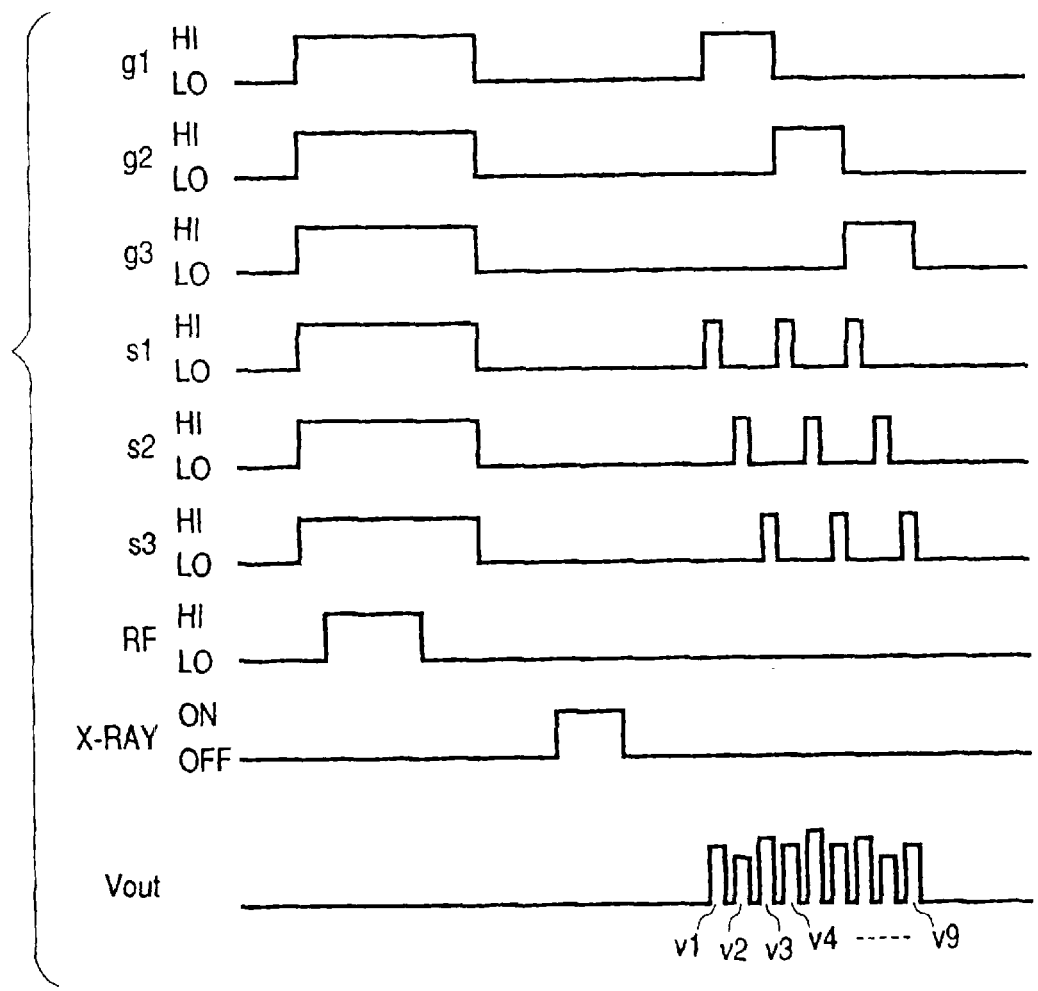
FIGS. 4 and 5 are timing diagrams for illustrating examples of the driving of the photoelectric transducer.

In the operation shown in FIG. 4, the refresh is operated simultaneously on all Vg-drive wires, and hence on-pulses of g1 to g3 rise simultaneously.

As for the drive wires g1 to g3, the moment the on-pulses of g1 to g3 rise simultaneously, the potential of signal wires and sensor bias wires drops a moment because of capacitance $C_{CR1}$ at the part where a drive wire and a signal wire cross and capacitance $C_{CR2}$ at the part where a drive wire and a sensor bias wire cross, shown in FIG. 3.

After individual potentials of the signal wire and bias wire have dropped a moment, they return to the original potentials on account of their time constants.

However, when any sufficient time can not be taken after the individual potentials have dropped a moment and until they return to the original potentials, i.e., in FIG. 4, when any sufficient time can not be taken after X-rays are applied and photoelectric conversion has been performed by the sensors (photoelectric conversion elements) and until the g1 is turned on and signal electric charges are transferred by the TFTS, there is a possibility that any ideal outputs are not well obtainable, because the signal electric charges are transferred before the potentials of the signal wires or sensor bias wires return to the original potentials.

The signal electric charges are transferred before the potentials of the signal wires or sensor bias wires return to the original potentials, also when the individual time constants of the signal wires and sensor bias wires can not be made small, i.e., when the signal wires or sensor bias wires have a large wiring resistance or have a great stray capacitance. Hence, there is also a possibility that any ideal outputs are not well obtainable.

This is due to the fact that the signal output $V_{out}$ depends on the potential of the signal wires or sensor bias wires.

In such cases, there is a possibility that the signal output at the beginning of reading when signal electric charges are read, i.e., in FIG. 4 the output of v1 at $V_{out}$ is a little not ideal.

In the present invention, in order to make the signal output more uniform in the two-dimensional area and to more improve reading quality, the timing of the rise of on-pulses of g1 to g3 in the refresh operation is staggered. Such staggering can make small the amount of change in potential at the time the potential of signal wires or sensor bias wires drops a moment.

Figure 5:
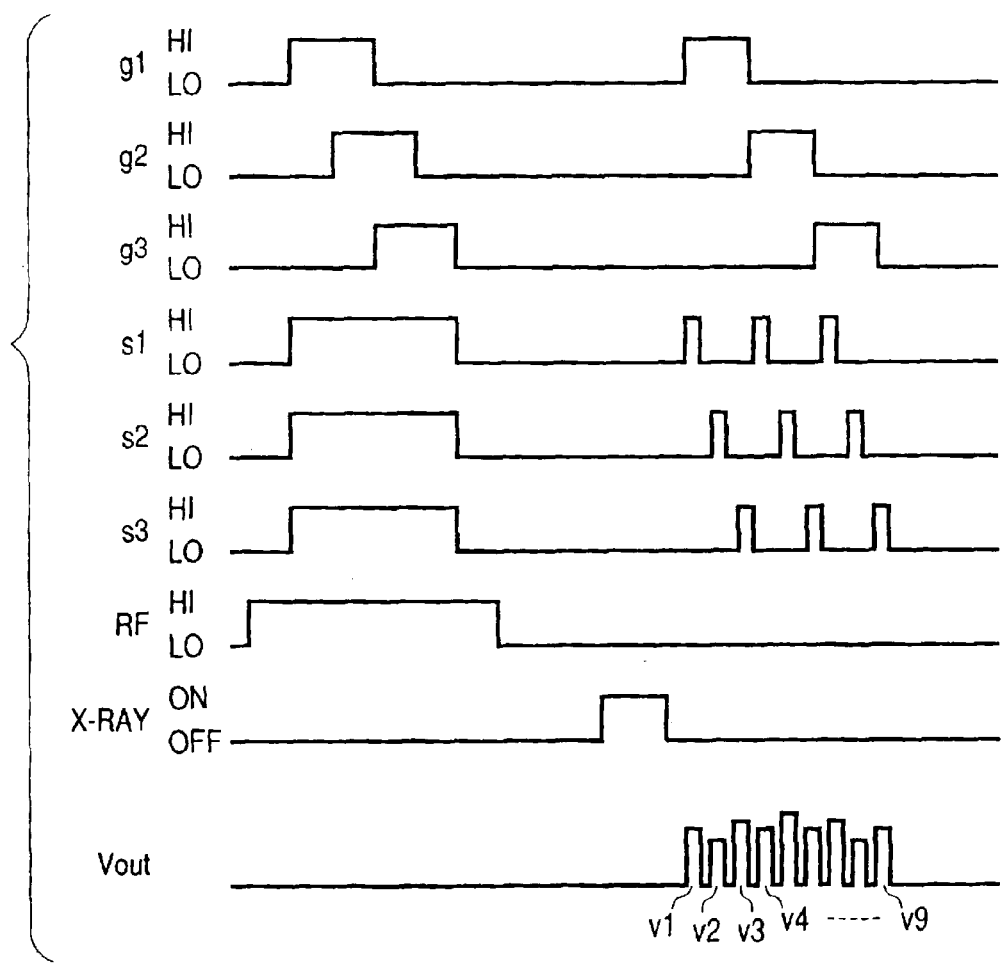

FIG. 5 is a timing diagram for illustrating an embodiment according to the present invention. In FIG. 5, portions corresponding to the operation shown in FIG. 4 are denoted by like reference numerals or symbols to omit description thereon.

A characteristic point in the timing chart shown in FIG. 5 is that, as mentioned above, the timing of the rise of on-pulses of g1 to g3 is staggered. Such staggering can make small the amount of change in potential at the time the potential of signal wires or sensor bias wires drops a moment, so that the time taken for the potential of signal wires or sensor bias wires to return to the original potential can be shortened.

A more characteristic point is that, in the manner of staggering the timing of the rise of on-pulses of g1 to g3, the timing at which two drive wires provided at least consecutively (g1 and g2, or g2 and g3) are turned on overlaps partly, and preferably approximately overlaps by a half of the pulse width. The circuit is so driven that the timing at which two drive wires provided at least consecutively are turned on overlaps in this way, whereby the time for which all the drive wires are refreshed can be shortened to also enable high-speed drive as required for aminated images.

As described above, since the circuit is so driven that the timing of the rise of on-pulses at the time of refresh is staggered in such a way that the timing at which two drive wires provided at least consecutively are turned on overlaps, the amount of change in potential at the time the potential of signal wires or sensor bias wires drops a moment can be made small within the refresh time which is relatively short, so that a plurality of signal outputs in the two-dimensional area can be made more uniform in a short time and the quality of panels can be more improved.

In the above photoelectric transducer, nine pixels are two-dimensionally arranged in a 3×3 fashion, and outputs are transferred and outputted simultaneously for each three pixels and dividedly three times, but arrangement is by no means limited to this. For example, where 5×5 pixels per 1 mm in length and breadth are two-dimensionally arranged as 2,000×2,000 pixels, an X-ray detector of 40 cm×40 cm can be obtained. This detector may be substituted for an X-ray film and be used in combination with an X-ray generator to set up an X-ray examination apparatus, which can be used in chest X-ray examinations or breast cancer examinations. Accordingly, as being different from films, the outputs can instantaneously be shown on a display such as a CRT, and the outputs can further be converted to a digital form and image-processed by a computer so as to be converted to outputs adapted to purposes. Also, the outputs can be stored in image recording mediums such as optical magnetic disks, where any images in the past can instantaneously be retrieved. Still also, sharp images can be obtained in a sensitivity better than that of films and using weak X-rays which may less affect human bodies.

Figure 6:
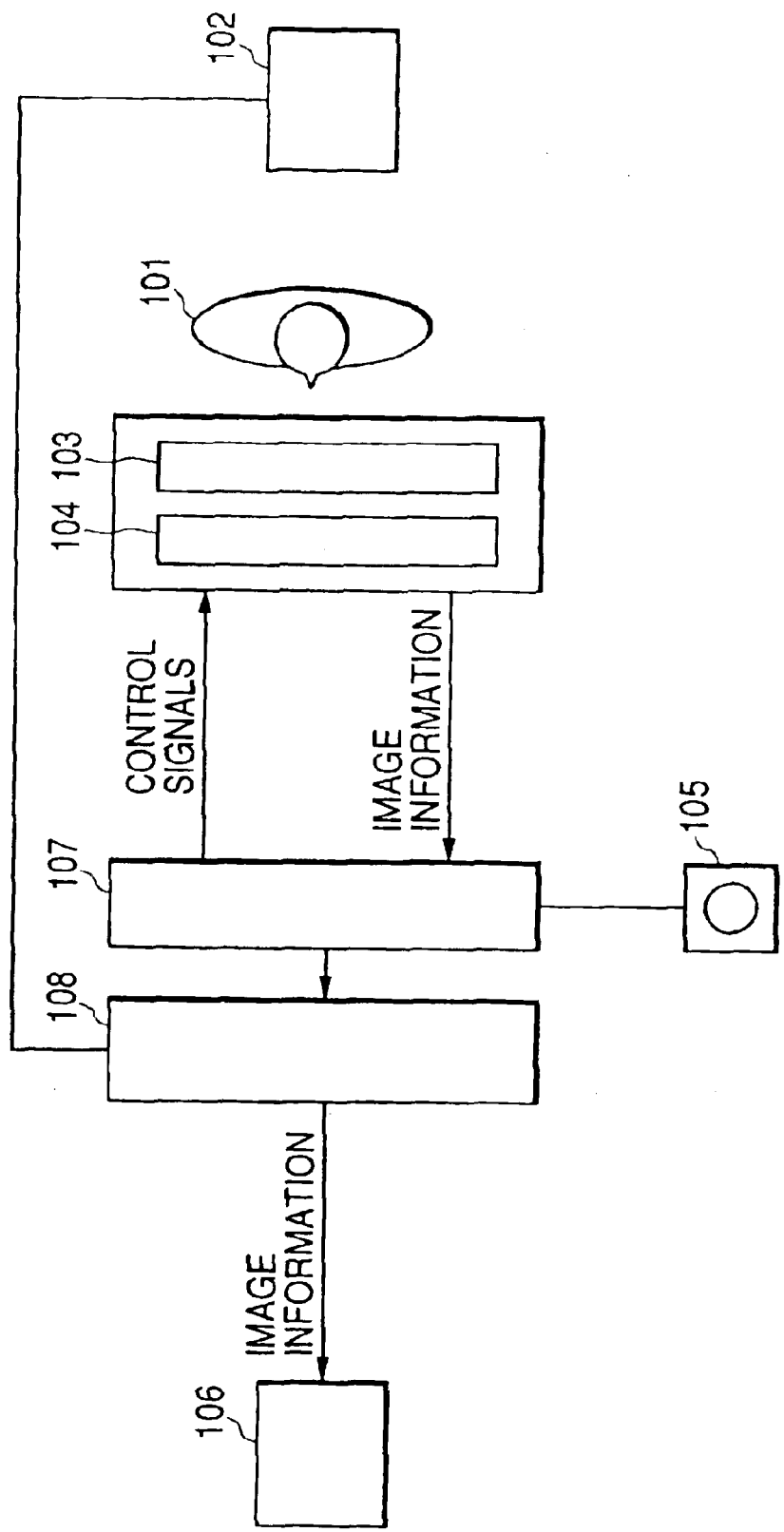
FIG. 6 is a diagrammatic illustration showing an example of an X-ray imaging system.

FIG. 6 shows its example. In FIG. 6, reference numeral 101 denotes a subject such as a patient; 102, an X-ray source; 103, a wavelength converter such as a phosphor; 104, the photoelectric transducer; 105, a photographing switch; 106, a display; 107, a control circuit; and 108, a drive circuit.

In the system shown in FIG. 6, photographing signals from the photographing switch 105 are inputted to the control circuit 107, whereupon signals for the emission of X-rays are inputted from the control circuit 107 to the drive circuit 108. The drive circuit 108 drives the X-ray source 102 in accordance with that signals to set it to emit X-rays.

The X-rays emitted are applied to the subject 101. The X-rays having passed through the subject 101 enters the wavelength converter 103, and are brought to wavelength conversion there. Wavelength-converted light is then photoelectrically converted into electrical signals by means of the photoelectric transducer 104 driven by the control circuit 107. As electric signals holding the image information, the signals are appropriately processed through the drive circuit 108 via the control circuit 107, and then displayed on a display 106. Of course, in addition to the display 106 or in place of the display 106, a storage means such as a semiconductor memory, an optical disk or an optical magnetic disk or a means of output to film or paper may be connected.

As described above, the circuit is so driven that the timing of the rise of on-pulses at the time of refresh is staggered in such a way that the timing at which two drive wires provided at least consecutively are turned on overlaps. Hence, the amount of change in potential at the time the potential of signal wires or sensor bias wires drops a moment can be made small within the refresh time which is relatively short, so that a plurality of signal outputs in the two-dimensional area can be made more uniform in a short time and the quality of panels can be more improved.

What is claimed is:

1. A photoelectric conversion device comprising:
   a photoelectric conversion matrix in which a plurality of photoelectric conversion elements to which sensors and switching elements are connected are two-dimensionally arranged;
   a plurality of drive wires connected individually to the switching elements arranged in one direction of the photoelectric conversion matrix;
   a plurality of signal wires connected individually to the output side of the switching elements arranged in another direction of the photoelectric conversion matrix;

a control means by which on-pulses are applied to the drive wires, and by which the switching elements connected to the respective drive wires are turned on;

wherein the photoelectric conversion elements being driven in a photoelectric conversion mode, a signal electric-charge transfer mode and a refresh mode; and wherein, in the refresh mode, the control means are controlled such that the timing of respective on-pulses applied to at least two of the drive wires which are sequentially and consecutively turned on overlaps.

2. The photoelectric conversion device according to claim 1, wherein terminals of all the sensors, on the side opposite to the switching element connections are connected to wirings whose potentials are changeable in at least the photoelectric conversion mode and the refresh mode.

3. The photoelectric conversion device according to claim 1, wherein the sensors and the switching elements are provided on the same substrate.

4. The photoelectric conversion device according to claim 3, wherein the sensors and the switching elements each have a portion where a first electrode layer, an insulating layer, a semiconductor layer, a high-density impurity semiconductor layer and a second electrode layer are superposed in order.

5. The photoelectric conversion device according to claim 1, comprising:

a photoelectric conversion element comprising a first electrode layer, an insulating layer, a photoelectric conversion semiconductor layer, a semiconductor layer capable of blocking the injection of first conductivity type carriers, and a second electrode layer which are superposed on the same substrate;

a read means by which the first-conductivity type carriers, generated by signal light having entered the photoelectric conversion semiconductor layer, are made to stay in the photoelectric conversion semiconductor layer, and carriers of a second conductivity type different from the first-conductivity type-are applied to the second electrode layer;

a refresh means by which an electric field is applied to the photoelectric conversion element, and the electric field is applied to the photoelectric conversion element in the direction wherein the first-conductivity type carriers are applied from the photoelectric conversion semiconductor layer to the second electrode layer; and a signal output means for outputting the first-conductivity type carriers accumulated in the photoelectric conversion semiconductor layer in the course of a photoelectric conversion operation by the read means or outputting the second-conductivity type carriers applied to the second electrode layer.

6. The photoelectric conversion device according to claim 1, further comprising a wavelength converter on its image information input side.

7. The photoelectric conversion device according to claim 6, wherein the wavelength converter is a phosphor.

8. The photoelectric conversion device according to claim 1, wherein the photoelectric conversion element has a photoelectric conversion component and a capacitor.

9. A method of driving a photoelectric conversion device in which a plurality of photoelectric conversion elements to which sensors and switching elements are connected are two dimensionally arranged; a switching element matrix comprising the switching elements connected to drive wires, comprising the steps of sequentially driving the switching elements by applying on-pulses to the drive wires for each matrix line; transferring signal electric charges to signal wires arranged in a matrix column direction, to read signals sequentially; and driving the photoelectric conversion elements in a photoelectric conversion mode, a signal electric-charge transfer mode and a refresh mode;

wherein, in the refresh mode, the timing of respective on-pulses applied to at least two of the drive wires which are sequentially and consecutively turned on overlaps.

* * * * *

UNITED STATES PATENT AND TRADEMARK OFFICE
CERTIFICATE OF CORRECTION

PATENT NO. : 6,940,552 B2
DATED : September 6, 2005
INVENTOR(S) : Kobayashi et al.

It is certified that error appears in the above-identified patent and that said Letters Patent is hereby corrected as shown below:

<u>Title page,</u>
Item [*] Notice, delete "by 941" and insert -- by 1006 days --.

Signed and Sealed this

Eighteenth Day of April, 2006

JON W. DUDAS
*Director of the United States Patent and Trademark Office*